(12) United States Patent
Mizrahi et al.

(10) Patent No.: US 8,830,841 B1
(45) Date of Patent: Sep. 9, 2014

(54) OPERATIONS, ADMINISTRATION, AND MAINTENANCE (OAM) PROCESSING ENGINE

(75) Inventors: Tal Mizrahi, Haifa (IL); David Melman, D.N. Bikat Beit Hakerem (IL)

(73) Assignee: Marvell Israel (M.I.S.L) Ltd., Yokneam (IL)

( * ) Notice: Subject to any disclaimer, the term of this patent is extended or adjusted under 35 U.S.C. 154(b) by 437 days.

(21) Appl. No.: 13/069,119

(22) Filed: Mar. 22, 2011

Related U.S. Application Data

(60) Provisional application No. 61/316,721, filed on Mar. 23, 2010, provisional application No. 61/357,885, filed on Jun. 23, 2010.

(51) Int. Cl.
*H04L 12/26* (2006.01)

(52) U.S. Cl.
USPC ............. 370/241.1; 370/230.1; 370/236.1; 370/252

(58) Field of Classification Search
USPC ......... 370/230, 230.1, 236.2, 241.1, 412, 252
See application file for complete search history.

(56) References Cited

U.S. PATENT DOCUMENTS

| | | | |
|---|---|---|---|
| 6,377,583 B1 * | 4/2002 | Lyles et al. | 370/412 |
| 7,978,614 B2 * | 7/2011 | Wong et al. | 370/241.1 |
| 8,054,744 B1 | 11/2011 | Bishara et al. | |
| 8,089,876 B2 * | 1/2012 | Katsura et al. | 370/230.1 |
| 8,229,705 B1 | 7/2012 | Mizrahi et al. | |
| 8,599,858 B1 | 12/2013 | Mizrahi | |
| 2007/0263535 A1 * | 11/2007 | Shabtay | 370/230 |
| 2010/0054132 A1 * | 3/2010 | Mitsumori | 370/236.2 |

OTHER PUBLICATIONS

IEEE Std 802.1ag™-2007 (Amendment to IEEE 802.1Q™-2005 as amended by IEEE Std 802.1ad™-2005 and IEEE Std 802.1ak™-2007), IEEE Standard for Local and Metropolitan Area Networks—Virtual Bridged Local Area Networks, Amendment 5: Connectivity Fault Management, Dec. 17, 2007.

ITU-T, Y.1731, Series Y: Global Information Infrastructure, Internet Protocol Aspects and Next-Generation Networks, Internet Protocol Aspects—Operation, Administration and Maintenance, OAM Functions and Mechanisms for Ethernet Based Networks, International Telecommunication Union, Feb. 2008.

MPLS-TP OAM Based on Y.1731 draft-bhh-mpls-tp-oam-y1731-04.txt, MPLS Working Group Internet Draft, Mar. 8, 2010.

* cited by examiner

*Primary Examiner* — Brian D Nguyen
*Assistant Examiner* — Toan Nguyen

(57) ABSTRACT

A multi-stage engine for processing Operations, Administration, and Maintenance (OAM) data units in a network device that includes a memory and an ingress interface from which an OAM data unit is received, includes a first processing stage in a network device, such that the first processing engine is configured to identify a flow of communication traffic to which the OAM data unit belongs, where the flow of communication traffic is identified from among a plurality of flows of communicate traffic received by the network device, and a second processing stage includes an action identification module to identify in the memory an action corresponding to the identified flow using the OAM data unit, and a processing module to process the OAM data unit in accordance with the identified action.

22 Claims, 6 Drawing Sheets

OPERATIONS, ADMINISTRATION, AND MAINTENANCE (OAM) PROCESSING ENGINE

CROSS-REFERENCE TO RELATED APPLICATION

This application that claims the benefit of U.S. Provisional Patent Applications Nos. 61/316,721, filed on Mar. 23, 2010, and 61/357,885, filed on Jun. 23, 2010, each of which is entitled "Operations, Administration, and Maintenance (OAM) Engine in Networking Switches." The entire disclosures of both of these applications are hereby incorporated by reference herein.

FIELD OF THE DISCLOSURE

The present disclosure relates generally to communication networks and, more particularly, to network devices such as switches, routers, and edge devices.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

To monitor connectivity, detect link failures, and monitor various performance parameters of computer networks, network devices such as network switches, routers, edge devices and the like often implement Operation, Administration and Maintenance (OAM) functions. OAM functions sometimes include Connectivity and Fault Management (CFM) functions as defined in ITU-T Y.1731, 802.1ag, or MPLS-TP OAM (currently being developed), for example, to detect and report link failures. Typically, OAM functions involve communicating OAM packets in a computer network, and then processing the OAM packets at the network device.

SUMMARY

In an embodiment, a multi-stage engine for processing Operations, Administration, and Maintenance (OAM) data units in a network device that includes a memory and an ingress interface from which an OAM data unit is received, includes a first processing stage in a network device, such that the first processing engine is configured to identify a flow of communication traffic to which the OAM data unit belongs, where the flow of communication traffic is identified from among a plurality of flows of communicate traffic received by the network device, and a second processing stage includes an action identification module to identify in the memory an action corresponding to the identified flow using the OAM data unit, and a processing module to process the OAM data unit in accordance with the identified action.

In another embodiment, a method for processing an Operations, Administration, and Maintenance (OAM) data unit in a network device includes receiving network traffic that includes the OAM data unit; identifying, from among a plurality of data flows of network traffic received by the network device, a data flow to which the OAM data unit belongs at a first processing stage implemented by the network device; identifying in a memory of the network device an action corresponding to the OAM data unit at a second processing stage implemented by the network device, where the action is identified based at least in part on the identified flow; and processing the OAM data unit in accordance with the identified action at the second processing stage.

According to some embodiments, a network device includes an ingress interface to receive network traffic that includes an OAM data unit, an egress interface to transmit the network traffic, and a flow identification module to identify, from among a plurality of data flows of network traffic, a data flow to which the OAM data unit belongs. The network switch also includes a processor configured to execute machine readable instructions stored on a computer-readable medium to identify an action corresponding to the OAM data unit based, at least in part, on the data flow, and process the OAM data unit in accordance with the identified action. In one such embodiment, the flow identification module includes a CAM unit. In an embodiment, the network device includes RAM unit to store a table that includes a plurality of actions, including the identified action, as a plurality of respective records, so wherein the flow identification module unit generates an index to the table in response to identifying the data flow. Further, in an embodiment that includes RAM unit that stores a table with a plurality of actions, each of the plurality of records includes a flag to indicate whether the processor should process a data unit associated with the record based on an operation code (opcode) of the data unit. Still further, in another embodiment that includes RAM unit that stores a table with a plurality of actions, each of the plurality of records includes at least one of: (i) a first flag to indicate whether the second module should increment a loss measurement (LM) counter in response to receiving a data unit associated with the record, (ii) a second flag to indicate whether the processing module should insert a timestamp into the data unit; (iii) a third flag to indicate whether the processor should use the OAM data unit in keep-alive aging.

DETAILED DESCRIPTION

Example methods and apparatus are described herein in the context of Ethernet networks. One of ordinary skill in the art will recognize, in light of the disclosure and teachings herein, that similar methods and apparatus are suitable for use in other communication networks as well.

Figure 1:
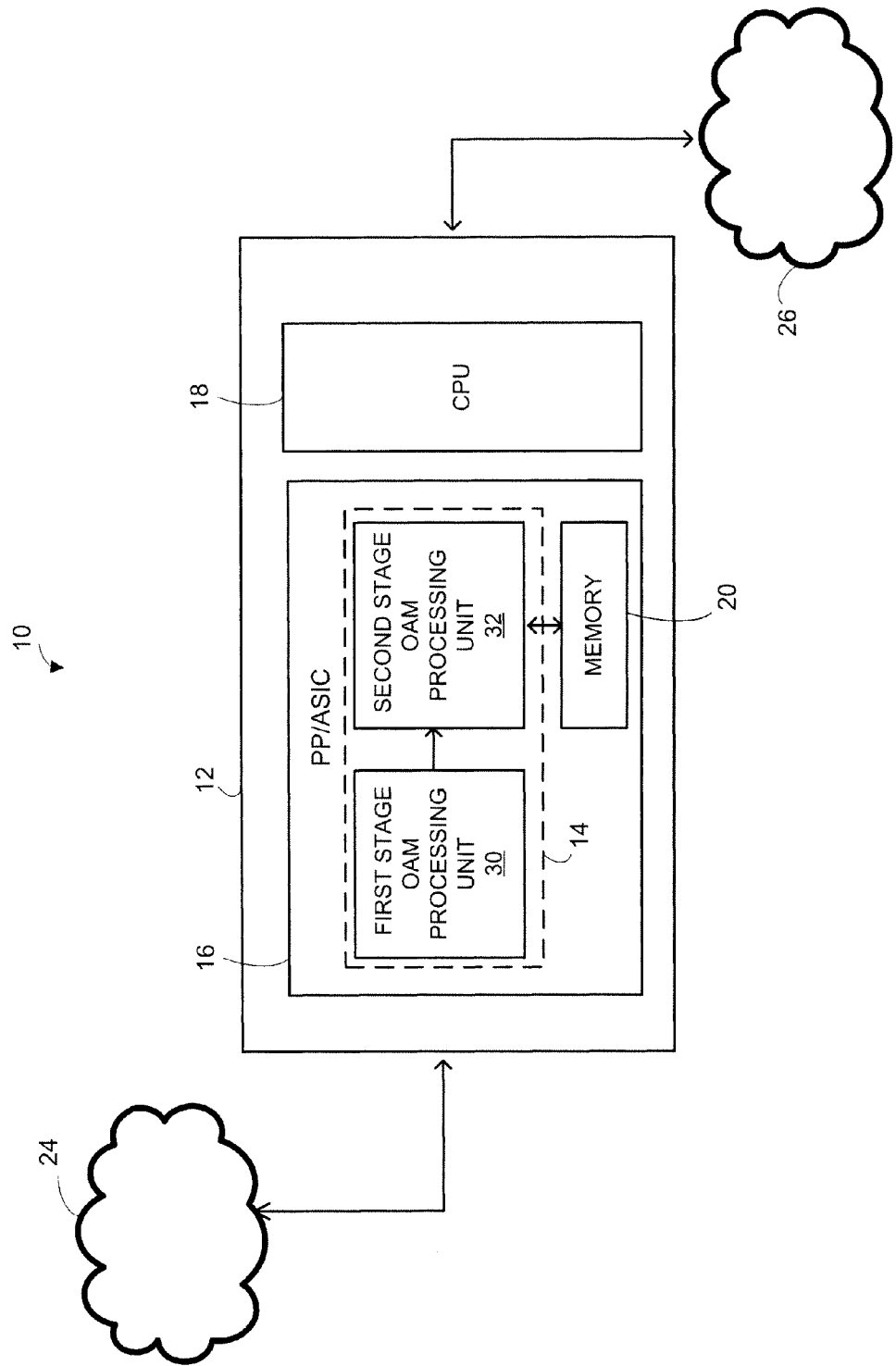
FIG. 1 is a block diagram of a communication system in which a network switch with a multi-stage OAM processing engine is utilized, according to an embodiment of the present disclosure.

FIG. 1 is a block diagram of a communication system 10 in which a network device 12 is configured to efficiently process OAM packets using a multi-stage OAM processing engine 14, in accordance with an embodiment of the present disclosure. The network device 12 is suitably a network switch, router, edge device or any other suitable network device that is configured to process OAM packets. In an embodiment, the network device 12 includes a packet processor 16, implemented using an application-specific integrated circuit (ASIC) or other hardware components, and a CPU 18 (or another suitable type of a controller) configured to process selected packets, such as, but not only, OAM packets using computer instructions stored in a non-transitory memory unit 20. In another embodiment, a network device includes hardware components configured to implement the functionality of the packet processor 16 as well as processing of selected packets. It is noted that the packet processor 16 typically includes several additional processing modules which are not seen in an effort to avoid obfuscating teaching principles of the present disclosure.

The network device 12 in the example communication system 10 is disposed between an external network 24 and an internal network 26, although generally the network device 12 can operate in any desired configuration (e.g., in a wide area network (WAN), a local area network (LAN)). In one embodiment, the packet processor 16 and the CPU 18 are disposed on the same integrated circuit (IC). In another embodiment, the packet processor 16 and the CPU 18 are disposed on different ICs, but on the same circuit board.

In an embodiment, the OAM processing engine 14 includes a first stage OAM processing unit 30 and a second stage OAM processing unit 32 defining a first OAM processing stage and a second OAM processing stage, respectively. In an embodiment, both the first stage OAM processing unit 30 and the second stage OAM processing unit 32 are implemented in the packet processor/ASIC 16 as seen in FIG. 1. In other embodiments, the first stage OAM processing unit 30 is implemented in the packet processor/ASIC 16, while the second stage OAM processing unit 32 is implemented the CPU 18, or vice versa. In still other embodiments, both the first stage OAM processing unit 30 and the second stage OAM processing unit 32 are implemented in the CPU 18. In general, the first OAM processing stage is characterized by a relatively fast processing time that is capable of performing flow classification at least at the speed at which packets are received from the external network 24. The second OAM processing stage, however, is characterized by greater flexibility and/or relatively reduced cost due to configurable software and/or firmware components and/or random access memory architecture, according to an embodiment. The OAM processing engine 14 therefore performs certain operations, such as those that require wire-speed or near-wire-speed execution, using high performance hardware components and performs other operations, such as those that are not necessarily time-critical or that require multi-step processing or that require accessing relatively large memories, using software and/or firmware and/or flexible memory components, according to an embodiment. Moreover, in some embodiments, the OAM processing engine 14 uses programmable offsets to provide additional flexibility in processing OAM data at various levels of encapsulation. In an embodiment discussed in more detail below, the first stage OAM processing unit 30 includes a content-addressable memory (CAM) that stores information suitable for classifying various OAM flows (e.g., a unique identifier for each of N OAM data flows of communication or network traffic, or simply "OAM flows") so as to identify an OAM flow to which a certain OAM packet belongs, and the second stage OAM processing unit 32 uses the identifier determined at the first OAM processing stage to access a table (stored in a random access memory (RAM) unit, for example) that identifies and/or describes one or several processing actions to be applied to OAM packets (and, in some embodiments, non-OAM packets) that belong to the identified flow.

As used herein, the term "OAM packets" refers to data units (e.g., packets, frames) that carry information used to monitor or control the health of a network, and includes OAM and/or CFM packets as defined by the ITU-T Y.1731, 802.1ag, or MPLS-TP OAM protocols, as well as data units that conform to similar standardized or proprietary protocols. Further, the term "OAM flow" in the present disclosure refers to a series of OAM packets that share one or several properties that are selected through configuration (e.g., by a network operator) or other definition (e.g., by a certain protocol or standard). As just one example, OAM packets in a certain OAM flow share the media access channel source address (MAC SA) and the service VLAN identity (S-VID). In general, an OAM flow can be defined to have a suitable number of properties.

Figure 2A:
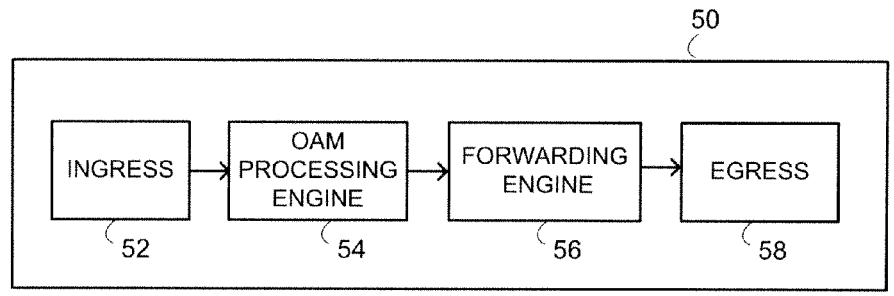
FIG. 2A is a block diagram of a network switch in which an OAM processing engine is associated with the ingress interface, according to an embodiment.

In an embodiment, the OAM processing engine 14 operates in an ingress processing module of a network device, such as a switch, router or edge device, however this need not be the case. Thus, in an embodiment, the OAM processing engine 14 optionally is disposed in an egress processing module, or is disposed in both the ingress and egress processing modules, respectively, of the network device. Referring to FIG. 2A, for example, a network device 50 (which may be used as the network device 12 in the communication system 10) includes an OAM processing engine 54 coupled to an ingress interface 52, according to an embodiment. The OAM processing engine 54 is similar or identical to the OAM processing engine 14 discussed with reference to FIG. 1. In an embodiment, the OAM processing engine 14 classifies and otherwise processes OAM packets according to properties generally associated with the ingress interface 52 (e.g., MAC SA, VLAN source port) and directs the processed OAM packets to a forwarding engine 56 which in turn is coupled to an egress interface 58. In some configurations discussed in more detail below, a forwarding engine such as the forwarding engine 56 includes several components, and the OAM processing engine determines to which of the several components of the forwarding engine an OAM packet should be directed.

Figure 2B:
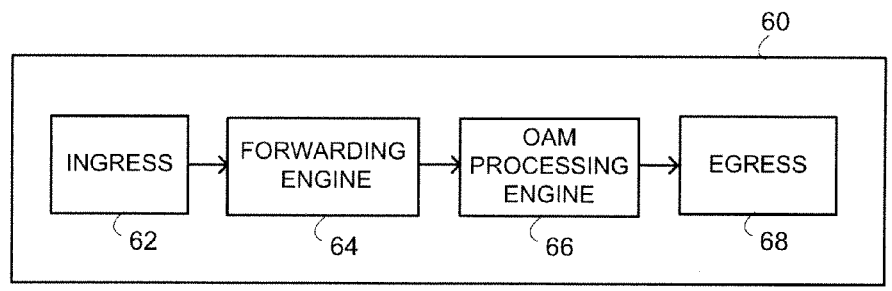
FIG. 2B is a block diagram of a network switch in which an OAM processing engine is associated with the egress interface, according to an embodiment.
Figure 2C:
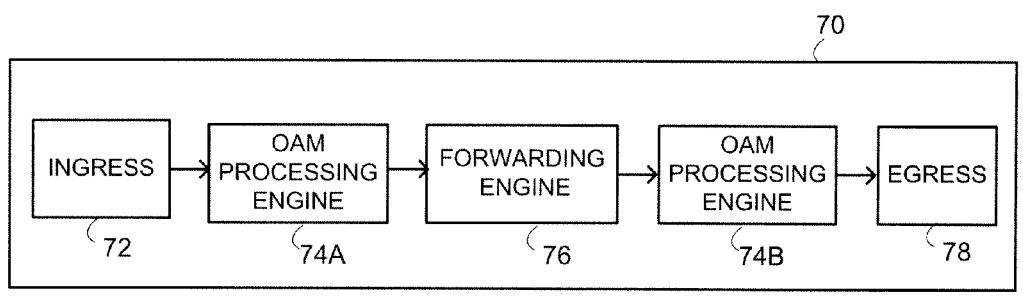
FIG. 2C is a block diagram of a network switch in which a first instance of an OAM processing engine is associated with the ingress interface, and a second instance of an OAM processing engine is associated with the egress interface, according to an embodiment.

On the other hand, a network device 60 illustrated FIG. 2B (which may be used as the network device 12 in the communication system 10) includes an ingress interface 62, a forwarding engine 64 coupled to the ingress interface 62, and an OAM processing engine 66 that classifies and otherwise processes OAM packets according to properties generally associated with an egress interface 68 (e.g., MAC DA, VLAN destination port). Further, in an embodiment illustrated in FIG. 2C, a network switch 70 includes an ingress interface 72, a first instance 74A of an OAM processing engine coupled to the ingress interface 72 to classify and process OAM packets at the ingress interface 72, a forwarding engine 76, a second instance 74B of an OAM processing engine coupled to the egress interface 78 to classify and process OAM packets directed to the egress interface 78.

Figure 5:
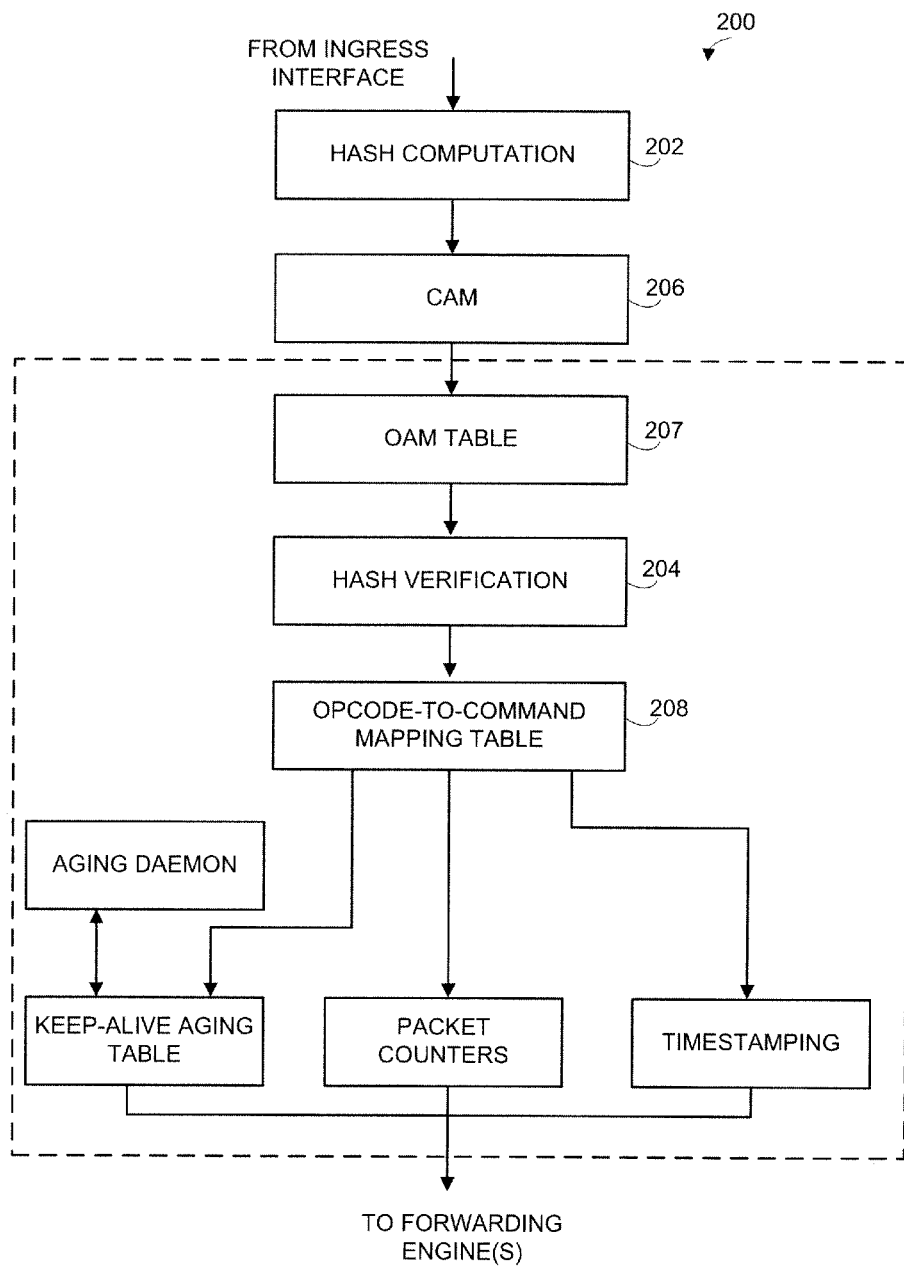
FIG. 5 is a block diagram of a multi-stage OAM processing engine that implements hash verification, according to an embodiment.

Several example embodiments of an OAM processing engine suitable to be used as the multi-stage OAM processing engine 14 are discussed with reference to FIGS. 3 and 5. First, however, several alternatives to the embodiments of FIGS. 3 and 5 are considered for clarity.

In general, it is possible to store every action for processing OAM flows in a CAM and/or TCAM unit. A typical OAM flow, however, is associated with numerous processing actions. As such, the structure of CAM and TCAM units makes such an arrangement impractical. For example, many CAM entries, possibly including repeated entries, would need to be defined for each of the different flows. For a network device that handles a large number of OAM flows, OAM processing that relies solely on a CAM unit to store the different actions would thus require a very large number of CAM entries. On the other hand, while it is possible to implement complete OAM flow processing in software and/or using RAM, such a design would likely make it very difficult to fully satisfy wire-speed processing requirements.

By contrast, in the embodiment of the multi-stage OAM processing engine 14 of FIG. 1, as well as other embodiments of an OAM processing engine discussed below, a relatively limited number of entries in a CAM (or another suitable type of search-efficient memory or mechanism for flow identification) is utilized to identify a flow, which in turn narrows the search in RAM for identifying the appropriate OAM action for a given packet which can then be accomplished significantly faster. Because an OAM processing engine consistent with these embodiments performs at least some potentially time-consuming but time-critical actions using high-speed hardware components, the necessary real-time requirements can be nevertheless satisfied.

Figure 3:
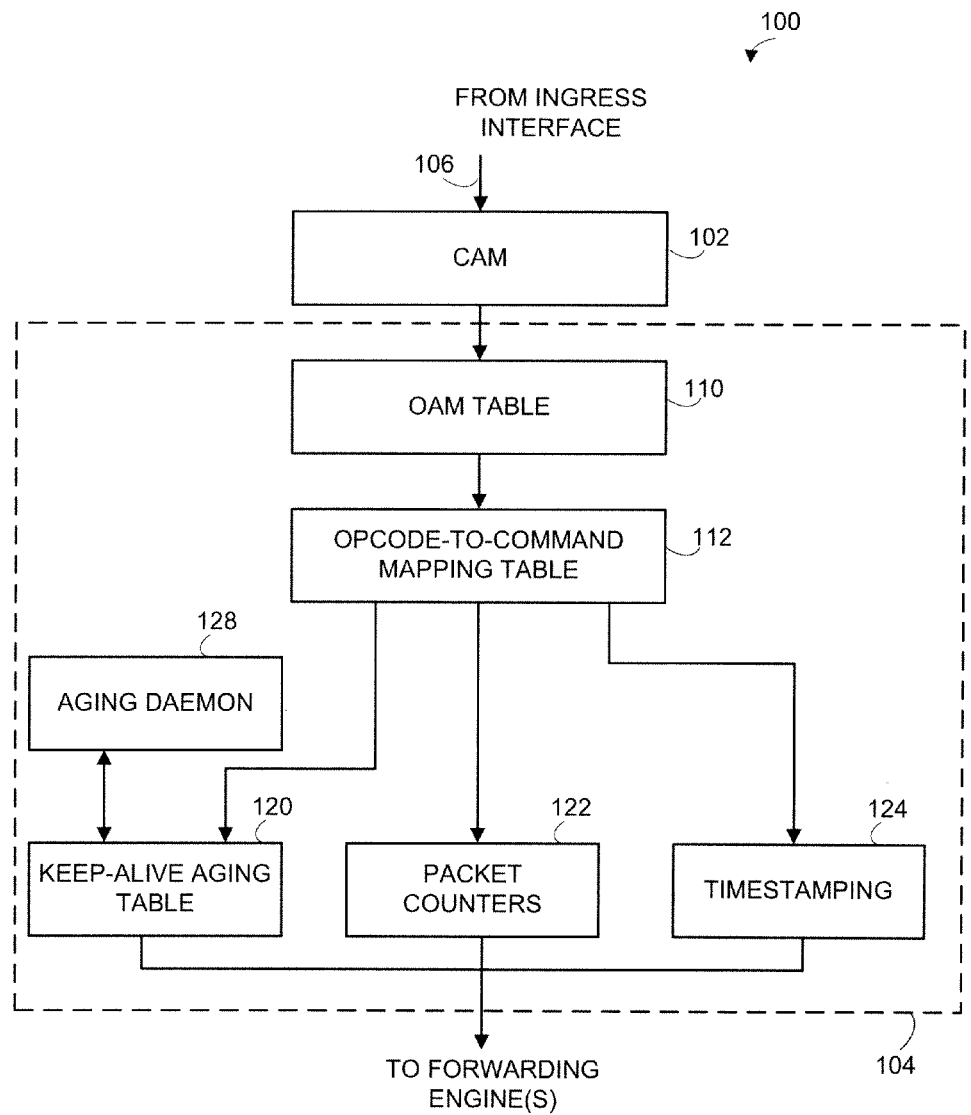
FIG. 3 is a block diagram of a multi-stage OAM processing engine, according to an embodiment.

For example, referring to FIG. 3, an OAM processing engine 100 can be used as the OAM processing engine 14 in the communication system 10, according to an embodiment. The OAM processing engine 100 includes a CAM unit 102 corresponding to a first OAM processing stage and an OAM controller 104 (e.g., a CPU configured to execute computer-readable instructions) corresponding to a second OAM processing stage, in an embodiment. The CAM unit 102 receives OAM packets from an ingress interface, for example, via an input 106, such as a port in the network device 12 (FIG. 1). Depending on the embodiment, the CAM unit 102 is implemented using binary CAM, ternary CAM (TCAM) to provide greater flexibility, or another suitable type of memory designed for efficient searching, and as used herein the term "CAM" equally refers to TCAM and other suitable memory units.

In an embodiment, an entry in the CAM unit 102 includes a data pattern that may occur in an OAM packet and a data word associated with the pattern to define a "CAM action." In some embodiments, a CAM action includes several parameters (e.g., indexes). In an example configuration, the CAM unit 102 is configured with N substantially unique patterns corresponding to N OAM flows, with each entry storing an index to an OAM table 110 (hereinafter, the "OAM table index"). In operation, the OAM processing engine 100 receives a packet and uses the CAM unit 102 to efficiently identify a stored pattern that matches parsed information from the packet to determine to which OAM flow, if any, the received packet belongs. In some embodiments, each CAM action effectively binds an OAM packet that includes the corresponding pattern to a certain maintenance entity (ME).

The OAM processing engine 100 in some embodiments also receives non-OAM packets which are identified as such. The OAM processing engine 100 directs the non-OAM packets to bypass OAM processing or, in some scenarios, to packet counters.

In an embodiment, a CAM action includes an OAM enable flag to indicate whether the CAM action corresponds to an OAM packet or another type of packet (e.g., a data packet). The OAM processing engine 100 need not direct a packet to the OAM controller 104 if the packet matches the data pattern of a CAM action in which the OAM enable flag is set to "false."

Once the OAM processing engine 100 has determined that (i) a packet is an OAM packet, and (ii) the packet belongs to OAM flow F, the OAM controller 104 applies one or several processing actions defined for the OAM flow F at the second OAM processing stage (e.g., in the OAM table 110). To this end, in an embodiment, the OAM controller 104 includes memory components as well logic components (e.g., software instructions executed by the OAM controller 104) that access the memory components. In accordance with some embodiments, the OAM controller 104 includes an action identification module (e.g., a table implemented in a CAM) to identify and obtain the processing action that corresponds to the identified flow, and a processing module (that can include one or several components) to apply the identified action, i.e., process the packet according to the action. Depending on the embodiment, the OAM controller 104 performs one or more of the following: verifying the Maintenance Entity Group (MEG) level of the packet, time-stamping the packet for delay measurement, using the packet for loss measurement (LM), using the packet for keep-alive aging, etc. To apply the proper action to an OAM packet received from the ingress interface (or directed at the egress interface), the OAM controller 104 checks the operation code (hereinafter, "opcode") specified in the header of the OAM packet according to an example processing action, or processes the OAM packet based on other information according to another processing action. In an embodiment, the OAM controller 104 includes a first module that includes the table 110 and 112 as well as the associated logic, and a second module that includes the components 120-128 or similar processing units, in accordance with an embodiment. Further, in some embodiments, the OAM controller 104 includes one or more tables (such as an offset table, a table that lists opcodes used for LM counting, etc.).

Depending on the embodiment, the OAM table 110 resides in RAM, ROM, or a similar type of memory. In some embodiments, the OAM table 110 is user-configurable. The OAM table 110, in an embodiment, is indexed by the OAM table index identified at the first OAM processing stage (e.g., using the CAM unit 102), and includes entries that conform to the format summarized below in Table 1. In other embodiments, an OAM table entry omits certain fields listed in Table 1 and/or includes additional fields not listed in Table 1.

TABLE 1

| Number of Bits | Field | Description |
|---|---|---|
| 1 | OAM Opcode Parsing Enable | This flag indicates whether the packet should be processed based on the opcode included in the packet, as discussed below. |
| 1 | LM Counting Enable | This flag indicates whether all or some of the packets should be counted by one or several LM counters, as discussed below. |
| 1 | MEG Level Check Enable | This flag indicates whether the MEG level of the packet should be compared to the |

TABLE 1-continued

| Number of Bits | Field | Description |
|---|---|---|
| | | level specified in the MEG level field, as discussed below. |
| 3 | MEG Level | This field specifies the threshold MEG level of the flow and used when the MEG Level Check Enable flag is set. |
| 1 | Dual-Ended LM Enable | This flag indicates whether packets with a certain opcode should be considered LM packets and the corresponding LM counter should be captured, as discussed below. |
| 1 | LM Counter Capture Enable | This flag indicates whether the LM counter of the packet should be captured and inserted into the packet, as discussed below. |
| 1 | Timestamp Enable | This flag indicates whether the a timestamp should be inserted into the packet, as discussed below. |
| 4 | Offset Index | This field stores an index to an offset table that specifies offsets within the packet at which information (e.g., an LM counter, a timestamp) should be inserted, as discussed below. |
| 1 | Keep-alive Aging Enable | This flag indicates whether packets with certain opcodes should be used for keep-alive aging analysis, as discussed below. |
| 12 | Age Table Index | This field stores an index to an aging table, as discussed below. |

In an embodiment, an OAM table entry includes the OAM Opcode Parsing Enable flag, as listed in Table 1. Accordingly, when the OAM Opcode Parsing Enable flag is set to "true," the processing action associated with the OAM table entry requires checking the opcode of the packet and selecting an action (a "packet command") according to the opcode. In some scenarios, an operator will set the OAM Opcode Parsing Enable flag to "true" to configure a network switch so as to process OAM flows consistent with the ITU-T Y.1731 or 802.1ag standards based on opcodes. In other scenarios, however, the operator sets the OAM Opcode Parsing Enable flag to "false." For example, the protocol to which a certain flow conforms may not define separate opcodes for such procedures as keep-alive aging, LM counting, etc., and therefore the opcode of the packet does not provide the OAM controller 104 with sufficient information relevant to these procedures. As another example, a generic time-stamping mechanism usually does not require that OAM packets be differentiated based on the opcode.

In some configurations, the OAM Opcode Parsing Enable flag is set to "true" for CFM flows, and one entry in CAM unit 102 as well as one entry in the OAM table 110 are allocated for a typical CFM flow. Similarly, one entry in the CAM unit 102 as well as one entry in the OAM table 110 are allocated for a typical non-CFM OAM flow, except that the OAM Opcode Parsing Enable flag is set to "false," and the OAM table entry additionally specifies a function (e.g., timestamping, LM measurement capturing) to be performed on the packet.

In an embodiment, the OAM controller 104 includes a table 112 that maps packet opcodes to corresponding processing units, such as a keep-alive aging table 120, a packet counter block 122, a timestamping unit 124, etc. Example embodiments of the keep-alive aging table 120, as well as an aging daemon 128 that services the keep-alive aging table 120, are described in the U.S. patent application Ser. No. 12/785,936 filed on May 24, 2010, the entire disclosure of which is hereby incorporated by reference herein. Further, example embodiments of the processing units 122 and 124 are described in the U.S. patent application Ser. No. 12/536,417 filed on Aug. 5, 2009, the entire disclosure of which is also hereby incorporated by reference herein.

With continued reference to FIG. 3 and Table 1, an OAM table entry, in an embodiment, includes the LM Counting Enable flag to selectively enable or disable LM counting. In an embodiment, a set of one or more LM counters is maintained for each flow. When the LM Counting Enable flag is set to "true," the OAM controller 104 additionally checks the OAM Opcode Parsing Enable flag discussed above, according to an embodiment. If the OAM Opcode Parsing Enable flag is set to "false," the OAM controller 104 increments the corresponding LM counter for each packet regardless of its opcode. In some embodiments, an LM counter is also updated in response to receiving a non-OAM packet, such as a data packet. On the other hand, if the OAM Opcode Parsing Enable flag is set to "true," the OAM controller 104 updates the corresponding LM counter only if the opcode of the packet matches one or several opcodes used for LM counting. For example, LM counting for a certain flow can be configured so that Continuity Check Message (CCM) packets are counted but Link Trace Message (LTM) packets are not counted. In some embodiments, the types of packets to be counted for LM purposes are defined by a standard (e.g., Y.1731).

In an embodiment, an LM counter is 32 bits long. Further, in an embodiment, network switches exchange LM counter values using LM Message (LMM) packets and LM Reply (LMR) packets.

In some embodiments, the OAM controller 104 checks the MEG level (e.g., the level within the hierarchy of maintenance association) of an OAM packet associated with a flow F if the MEG Level Check Enable flag in the corresponding entry of the OAM table 110 is set to "true." It is noted that a MEG generally corresponds to a physical or logical (e.g., administrative) portion of a computer network, and a given MEG can include two or more interconnected MEG End Points (MEPs) such as network switches, routers, etc. In an example configuration, the processing action further specifies a certain MEG level L in the MEG Level field and requires that a packet be dropped if the MEG level of the packet is lower or higher than that the MEG level L, and forwarded on if the MEG level of the packet is equal to the MEG level L. A certain predefined value (such as zero, for example) indicates that no packets are to be dropped due to the MEG level value of the packet, according on embodiment. In these embodiments, if the MEG Level Check Enable flag is set to "false," the OAM controller 104 does not check the MEG level of a packet.

An OAM table entry, in some embodiments, also includes the Dual-Ended LM Enable flag. When set to "true," the Dual-Ended LM Enable flag indicates to the OAM controller 104 that a packet with an opcode that matches a certain defined value (e.g., a DUAL-ENDED_LM_OPCODE configuration parameter used by the OAM processing engine 100) should be treated as an LM packet. In an embodiment, to process packets in this manner, the LM Counter Capture Enable and the OAM Opcode Parsing Enable flags also must be set to "true."

Still referring to FIG. 3 and Table 1, an OAM table entry includes the LM Counter Capture Enable flag to indicate whether the LM counter of the packet should be captured and inserted into the packet, in accordance with an embodiment. For example, if the LM Counter Capture Enable flag is set to "true," the OAM controller 104 should capture the current value of the LM counter and insert the captured value into the packet. In an embodiment, the OAM controller 104 inserts the value of the LM counter only if the packet is an LMM or LMR packet. For example, the OAM controller 104 checks the OAM Opcode Parsing Enable flag and compares the opcode of the packet to the corresponding list of opcodes.

The OAM controller 104 accesses an LM counter table (not shown) to retrieve the value of the appropriate LM counter, according to an embodiment. The LM counter table can be indexed using the index to the OAM table 110.

Referring to back to FIG. 2A, the OAM processing engine 54 inserts the current value of a receive (Rx) LM counter if the LM Counter Capture Enable flag is set to "true" because the OAM processing engine 54 is coupled to the ingress interface 52. On the other hand, referring to FIG. 2B, the OAM processing engine 66 inserts the current value of a transmit (Tx) LM counter if the LM Counter Capture Enable flag is set to "true" because the OAM processing engine 54 is coupled to the egress interface 68.

In an embodiment, both the LM Counter Capture Enable flag and the Dual-Ended LM Enable flag are set to "true" in a certain OAM table entry. If the opcode of the packet matches a certain opcode (the "Dual-Ended LM Enable opcode"), LM counter capture is enabled for the specified packet type.

In some embodiments, an OAM table entry includes the Timestamp Enable flag to indicate whether the current time, or another type of a timestamp, should be inserted into the packet. The timestamp can include a 48-bit seconds field and a 32-bit nanoseconds field, for example. In an embodiment, the length of the timestamp is eight bytes including the four least significant bytes of the seconds field and the four bytes of the nanoseconds field.

Further, in one such embodiment, the Offset Index field specifies the offset relative to the beginning of the packet at which the timestamp should be inserted into the packet. According to an embodiment, timestamping is required for Delay Measurement (DM) packets, and the OAM controller 104 accordingly timestamps DM packets regarding of the value of the Timestamp Enable flag.

Still further, when the Timestamp Enable flag is set to "true," the OAM controller 104 further checks the OAM Opcode Parsing Enable flag and, if necessary, the list of opcodes associated with this flag to determine whether all packets in the flow or only the packets with a certain opcode should be timestamped.

In an embodiment, an OAM table entry includes the Keep-alive Aging Enable flag to indicate whether keep-alive aging is enabled. Suitable techniques for managing keep-alive information in a network switch, as well components that can implement such techniques, are described in detail in the '936 application identified above. Briefly, the OAM processing engine 100 uses keep-alive aging techniques to verify the validity of a connection to another network node (e.g., another network switch) using periodic keep-alive messages sent at a certain, typically constant, periodicity. A link failure is detected in response to not receiving any keep-alive packets from the network node during n intervals. To this end, the OAM processing engine 100 maintains the state of each flow and generates a notification (to a certain application, service, etc.) when the last received keep-alive packet in the flow has aged beyond n intervals.

In an example scenario, the OAM controller 104 checks the opcode of the packet, determines whether the opcode matches an opcode in the list of keep-alive opcodes corresponding to the OAM table entry, and resets the age of the OAM flow to zero if the opcodes match. In an embodiment, the OAM controller accesses the appropriate entry in the keep-alive aging table 120 using the Age Table Index field. In an embodiment, the OAM controller 104 applies keep-alive aging techniques to CCM packets if the OAM flow is consistent with one of CFM standards.

With continued reference to FIG. 3, the opcode-to-command mapping table 112 maps opcodes to packet commands, according to an embodiment. Depending on the specific scenario, an opcode is mapped to the command FORWARD, MIRROR, TRAP, DROP, LOOP, etc. As a more specific example, the OAM controller 104 in a certain configuration traps LTM packets and loops back the packet of type Loopback (LBM). As another example, the OAM controller 104, in an embodiment, is configured to drop keep-alive packets. When the OAM controller 104 includes the opcode-to-command mapping table 112 or a similar module, it is generally unnecessary to define opcode-specific actions in the CAM unit 102.

In another embodiment, an OAM processing engine 100 stores two CAM actions that potentially apply to each packet: the first action is used for classification, i.e., to determine the flow to which the packet belongs, and the second action is used to bind the flow to an LM counter. Unlike the embodiment discussed above, in which N actions are stored in the CAM memory unit 102 for N flows, the OAM processing engine 100 in this embodiment requires 2N CAM actions. However, an OAM processing engine that uses 2N CAM actions in the first OAM processing stage identifies appropriate LM counters earlier and, in at least some implementations, faster than an OAM processing engine that uses the CAM memory unit 102 only for flow classification.

In yet another embodiment, the OAM processing engine 100 is configured with N+1 CAM actions in the first OAM processing stage for N flows. In this embodiment, one CAM action is used to determine whether the packet is an OAM packet, and N additional actions are used to determine to which flow the OAM packet belongs. If the OAM processing engine determines that the packet is a non-OAM packet, the packet bypasses the tables 110 and 122 and proceeds directly to the packet counter block 122. An OAM processing engine consistent with this embodiment can be used in configurations where both OAM and non-OAM traffic arrives at the OAM processing engine, for example.

As previously indicated, the functionality of the modules 120, 122, 124, and 128 is described in detail in the above-incorporated '936 and '417 patent applications. Briefly, in a typical embodiment, the keep-alive aging table 120 and the aging daemon 128 handle keep-alive packets such as CCM packets, for example. The packet counter 122 maintains LM counters (stored as variables in a RAM unit, for example) for various flows and, in some scenarios, inserts LM counter values into packets, and the timestamping unit 124 generates timestamps and inserts the generated timestamps into delay measurement or other packets, according to an embodiment.

Figure 4:
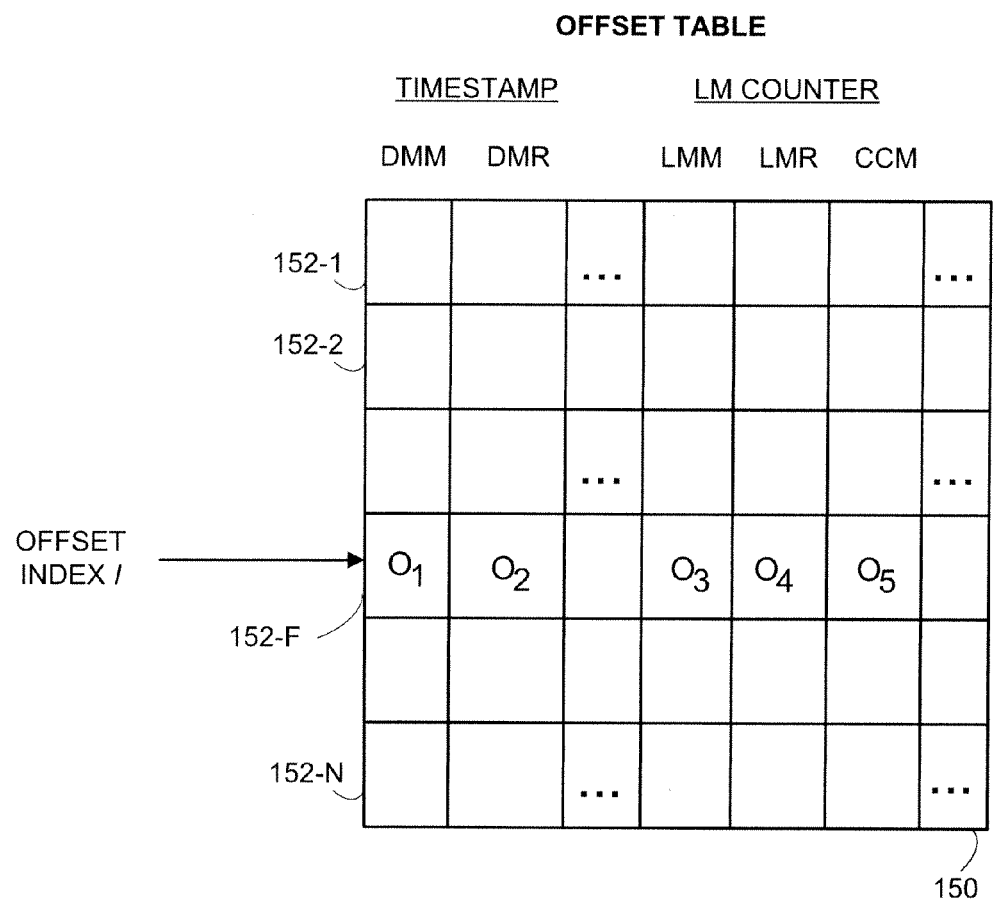
FIG. 4 is a block diagram of a memory unit that stores offsets to fields of OAM packets, according to an embodiment.

The OAM controller 104 in some embodiments accesses one or several portions of a packet for reading and/or writing using the Offset Index field in the corresponding OAM table entry. FIG. 4 illustrates an example offset table 150 which the OAM controller 104 uses to flexibly indicate positions of fields or information elements in packets of various types for various flows, according to an embodiment. The offset table 150 is allocated in RAM, ROM, or another type of memory, and includes N entries 152-1, 152-2, . . . 152-N. In an embodiment, each of the entries 152-1, 152-2, . . . 152-N specifies offsets relative to the beginning of Layer 2 (L2) portion of the packet for several message types. For example, in the entry 152-F corresponding to flow F and indexed by offset index I, the offset table 150 lists offset values $O_1$ and $O_2$ for inserting timestamp values into Delay Measurement Message (DMM)

and Delay Measurement Reply (DMR) packets, respectively. Further, in an embodiment, the entry 152-F lists offset values $O_3$-$O_5$ for inserting LM counter values into LMM, LMR, and CCM packets, respectively. Depending on the embodiment, entries of the offset table 150 list offsets for inserting information, as is the case with the offsets $O_1$-$O_5$, offsets for retrieving information (e.g., the offset of an LM counter received from another network device), or both. In this manner, the OAM controller 104 can efficiently processes packets for various types and levels of encapsulation. Further, in at least some of the embodiments, the offset table 150 is configurable so that non-standard flows can be configured for processing. In these cases, some of the columns defined for known message types, such as LMM or LMR, can be used for packets specific to the network switch that implements the offset table 150.

From the foregoing, it is noted that it is unnecessary to define opcode-specific actions in the CAM 102, and much of OAM processing can be performed using conventional memory resources (e.g., RAM) and software components in the OAM controller 104. Also, it will be noted that complex processing actions that can be defined, if desired, by setting multiple flags and/or parameter fields (e.g., indexes) in OAM table entries, thus making the OAM processing engine 100 flexible and robust. Moreover, indexing techniques discussed with reference to FIGS. 3 and 4 allow the OAM processing engine 100 to efficiently handle various types and levels encapsulation.

Referring to FIG. 5, an OAM processing engine 200 is generally similar to the OAM processing engine 100 discussed with reference to FIG. 3. However, the OAM processing engine 200 also implements hash verification of OAM packets to ensure correctness of inbound or outbound OAM packets. The OAM processing engine 200 includes a hash computation block 202 that computes a hash value based on a set of "interesting" fields (e.g, obtained by parsing information from the packets) and a hash verification block 204 to determine whether the computed hash value matches the hash value expected for the flow to which the packet belongs, according to an embodiment. Thus, in at least some of the embodiments of the OAM processing engine 200, a hash value is computed for a packet, the flow to which the packet belongs is identified, and an expected hash value corresponding to the flow is retrieved.

Depending on the embodiment, the hash computation block 202 is disposed upstream of a CAM unit 206 (that implements functions similar to the functions of the CAM unit 102), as illustrated in FIG. 5, downstream of the CAM unit 206, or parallel to the CAM unit 206. Further, the hash computation block 202 is suitably implemented in hardware, firmware, software, or a combination thereof, depending on the embodiment. Similarly, the hash verification unit 204 in various embodiments is disposed downstream or upstream of an opcode-to-command mapping table 208, and includes hardware components, firmware components, software components, or a combination thereof. In an embodiment, the hash verification unit 204 includes a table disposed in RAM, for example, to store expected hash values for various flow and/or packet types. Further, in an embodiment, the OAM processing engine 200 includes an OAM table 207 that stores entries that conform to the format summarized above in Table 1, for example. In an embodiment, an entry in the OAM table 207 includes an index to the hash value table associated with the hash verification unit 204.

In an embodiment, the selection of fields based on which the computation unit 202 computes a hash value is configurable. In general, hash computation can be based on flow types (e.g., a flow defined by a certain MAC SA and a certain S-VID) and or packet types (e.g., CCM packets). In an example scenario, a user configures the OAM processing engine 200 to compute a hash value based on the Ethernet type field, VLAN ID field, and the physical port on which the packet is received. In another example scenario, the hash value is based on the MAC SA field.

It is noted that the Y.1731 protocol specifies several defect conditions corresponding to such unexpected values in a CCM packet as the wrong MEG identity, the wrong MEP identity, and the wrong value of the Period field. In an embodiment, the OAM processing engine 200 is configured to efficiently detect these conditions by comparing a computed hash value to an expected hash value using flow classification results, as discussed above.

Figure 6:
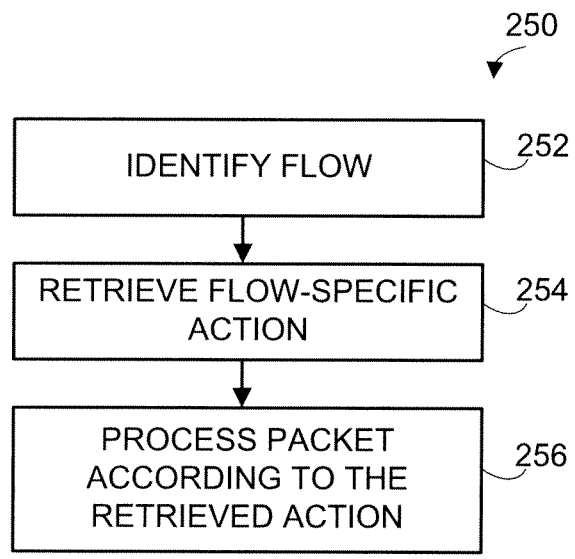
FIG. 6 is a flow diagram of an example method for processing OAM packets in several stages, in accordance with an embodiment of the present disclosure.

FIG. 6 is a flow diagram of an example method 250 for processing an OAM packet in an embodiment of the present disclosure. The example method 250 can be partially or fully implemented in the OAM processing engine 100 or 200, for example. At block 252, the flow to which a packet belongs is identified. Referring back to FIG. 3, for example, the CAM unit 102 implements block 252 according to an embodiment. In an embodiment, at block 254, an action that applies to the flow identified at block 252 is retrieved, and the packet is processed according to the retrieved action at block 256. Blocks 254 and 256 can be implemented using some or all of the components of the OAM controller 104, for example.

Figure 7:
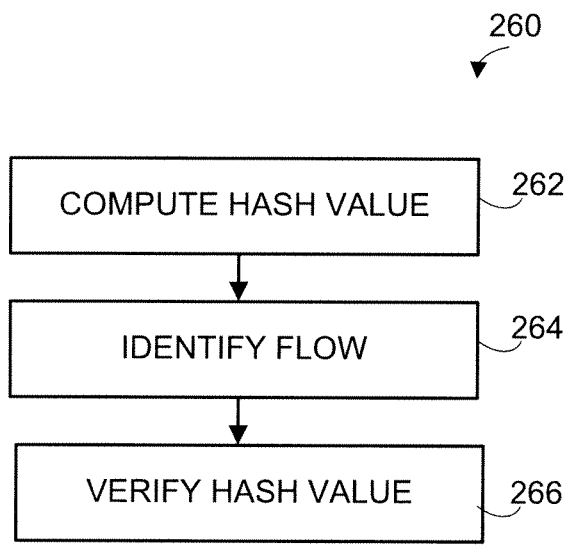
FIG. 7 is a flow diagram of an example method for verifying correctness of OAM packets.

Referring to FIG. 7, an example method 260 for verifying correctness of an OAM packet includes computing a hash value based on one or more fields of the packet at block 262. Next, at block 264, which is generally similar to block 252 discussed above, the flow to which the packet belongs is identified, according to an embodiment. In another embodiment, the type of the packet is also determined upon identifying the flow at block 264. At block 266, the hash value is verified in view of the identified flow and/or packet type, depending on the embodiment. For example, an expected hash value is retrieved from memory using the flow type, the packet type, or a combination thereof as an index and compared to the value computed at block 262. In some embodiments, a notification (e.g., an interrupt, a log file entry, a message to an application) is generated if the two hash values do not match. Referring back to FIG. 5, the blocks 262 and 266 can be implemented in the modules 202 and 204, respectively.

At least some of the various blocks, operations, and techniques described above may be implemented utilizing hardware, a processor executing firmware instructions, a processor executing software instructions, or any combination thereof. When implemented utilizing a processor executing software or firmware instructions, the software or firmware instructions may be stored on non-transitory computer readable medium such as on a magnetic disk, an optical disk, or other storage medium, in a RAM or ROM or flash memory, processor, hard disk drive, optical disk drive, tape drive, etc. Likewise, the software or firmware instructions may be delivered to a user or a system via any known or desired delivery method including, for example, on a computer readable disk or other transportable computer storage mechanism or via communication media. Communication media typically embodies computer readable instructions, data structures, program modules or other data in a modulated data signal such as a carrier wave or other transport mechanism. The software or firmware instructions may include machine readable instructions that, when executed by the processor, cause the processor to perform various acts.

While the present invention has been described with reference to specific examples, which are intended to be illustrative only and not to be limiting of the invention, it will be apparent to those of ordinary skill in the art that changes, additions and/or deletions may be made to the disclosed embodiments without departing from the spirit and scope of the invention.

What is claimed is:

1. A multi-stage engine for processing Operations, Administration, and Maintenance (OAM) data units in a network device that includes an ingress interface from which an OAM data unit is received, the engine comprising:
    a memory to store OAM action data indicating a plurality of sets of OAM actions to be performed with respect to OAM data units in a plurality of flows of communication traffic received by the network device;
    a first processing stage in a network device, the first processing stage configured to:
        identify a first flow of communication traffic to which the OAM data unit belongs, wherein the first flow of communication traffic is identified from among the plurality of flows of communication traffic, and
        generate an indicator of the first flow of communication traffic to which the OAM data unit belongs; and
    a second processing stage including
        an action identification module to identify, from the OAM action data stored in the memory, a first set of multiple OAM actions corresponding to the first flow using the indicator generated by the first processing stage, wherein the first set of multiple OAM actions includes at least one action that involves modifying the OAM data unit; and
        a processing module to process the OAM data unit in accordance with the first set of multiple OAM actions identified by the action identification module.

2. The engine of claim 1, wherein the first processing stage includes one of a content-addressable memory (CAM) unit or a ternary CAM (TCAM) unit.

3. The engine of claim 1, wherein the memory stores a table having a plurality of entries corresponding to respective sets of OAM actions among the plurality of sets of OAM actions, with a first entry in the plurality of entries corresponding to the first set of multiple OAM actions, and
    wherein the action identification module is configured to use the indicator of the first flow as an index to the table.

4. The engine of claim 3, wherein the memory comprises a random access memory (RAM) unit in which the table is disposed.

5. The engine of claim 3, wherein each of multiple entries among the plurality of entries includes a respective flag to indicate whether the processing module should process a data unit associated with the each of the multiple entries based on an operation code (opcode) of the data unit.

6. The engine of claim 5, wherein the second processing stage further includes an opcode mapping table to map a plurality of opcodes to a plurality of actions.

7. The engine of claim 3, wherein each of multiple entries among the plurality of entries includes at least one of: (i) a respective first flag to indicate whether the processing module should increment a loss measurement (LM) counter in response to receiving a data unit associated with the each of the multiple entries, (ii) a respective second flag to indicate whether the processing module should insert a timestamp into the data unit associated with the each of the multiple entries, and (iii) a respective third flag to indicate whether the processing module should use the data unit associated with the each of the multiple entries in keep-alive aging.

8. The engine of claim 3, wherein each of multiple entries among the plurality of entries includes a respective Maintenance Entity Group (MEG) threshold level, and
    wherein the second processing stage is configured to (i) drop a data unit associated with the each of the multiple entries in response to a MEG level of the data unit not meeting the respective MEG threshold level, and (ii) forward the data unit associated with the each of the multiple entries to the processing module in response to the MEG level of the data unit meeting the respective MEG threshold level.

9. The engine of claim 3, wherein: the table is a first table,
    each of multiple entries among the plurality of entries of the first table stores a respective index to a second table which is an offset table, and
    each of multiple entries among a plurality of entries in the second table specifies a location within a data unit associated with the each of the multiple entries of the second table at which the processing module should insert one of a LM counter or a timestamp.

10. The engine of claim 1, wherein the processing module includes at least one of a keep-alive aging module, a packet counter, and a timestamping module.

11. The engine of claim 1, further comprising:
    a hash computation unit to compute a hash value based on the OAM data unit; and
    a hash verification unit to (i) compare the computed hash value to an expected hash value, and (ii) generate a mismatch indication if the computed hash value does not match the expected hash value.

12. A method for processing an Operations, Administration, and Maintenance (OAM) data unit in a network device, the method comprising:
    receiving, via the network device, network traffic that includes the OAM data unit;
    identifying, from among a plurality of data flows of network traffic received by the network device, a first data flow to which the OAM data unit belongs at a first processing stage implemented by the network device;
    generating an indicator of the first data flow to which the OAM data unit belongs;
    identifying in a memory of the network device a first set of multiple OAM actions corresponding to the OAM data unit at a second processing stage implemented by the network device, wherein
        the first set of multiple OAM actions is identified based at least in part on the indicator of the first data flow,
        the first set of multiple OAM actions is among a plurality of sets of OAM actions indicated by OAM action data stored in the memory, and
        the first set of multiple OAM actions includes at least one action that involves modifying the OAM data unit; and
    processing the OAM data unit in accordance with the first set of multiple OAM actions identified at the second processing stage.

13. The method of claim 12, wherein:
    identifying the flow at the first processing stage includes using a content-addressable memory (CAM) unit to obtain the indicator of the first data flow;
    identifying the first set of multiple OAM actions comprises:
        using the indicator of the first data flow as an index to a table associated with the second processing stage, the table stored in the memory, and selecting the first set of multiple OAM actions from among the plurality of sets of OAM actions indicated by OAM action data stored in the table using the index.

14. The method of claim 13, wherein the memory comprises a random access memory (RAM), wherein identifying the first set of multiple OAM actions includes retrieving data from the RAM, wherein the table is stored in the RAM.

15. The method of claim 12, wherein processing the OAM data unit in accordance with the first set of multiple OAM actions includes at least one of:
   incrementing a loss measurement (LM) counter if OAM action data corresponding to the first set of multiple OAM actions includes a first indication;
   inserting a timestamp into the OAM data unit if OAM action data corresponding to the first set of multiple OAM actions includes a second indication; and
   using the OAM data unit in keep-alive aging if OAM action data corresponding to the first set of multiple OAM actions includes a third indication.

16. The method of claim 12, wherein processing the OAM data unit in accordance with the first set of multiple OAM actions includes:
   determining a Maintenance Entity Group (MEG) level of the OAM data unit;
   determining a MEG level of the identified flow;
   dropping the OAM data unit if the MEG level of the identified flow does not meet the MEG level of the OAM data unit; and
   forwarding the OAM data unit if the MEG level of the identified flow meets the MEG level of the OAM data unit.

17. The method of claim 12, wherein identifying the first set of multiple OAM actions corresponding to the OAM data unit includes:
   selecting a first type of action to apply to the OAM data unit based on an operation code (opcode) of the OAM data unit if OAM action data corresponding to the first set of multiple OAM actions includes a first indication; and
   selecting a second type of action to apply to the OAM data unit based on a second indication included in the identified action if OAM action data corresponding to the first set of multiple OAM actions does not include the first indication.

18. The method of claim 17, wherein the first type of action is selected from a command set that includes forward, mirror, trap, drop, and loop, and the second type of action includes one of generating a timestamp and incrementing an LM counter.

19. The method of claim 12, further comprising:
   computing a hash value based on the OAM data unit;
   obtaining an expected hash value corresponding to the identified flow;
   comparing the computed hash value to the expected hash value; and
   generating a mismatch indication if the computed hash value does not match the expected hash value.

20. The method of claim 12, further comprising:
   computing a hash value based on the OAM data unit;
   obtaining an expected hash value corresponding to a type of the OAM data unit;
   comparing the computed hash value to the expected hash value; and
   generating a mismatch indication if the computed hash value does not match the expected hash value.

21. The method of claim 12, wherein the first processing stage is implemented in hardware, and the second processing stage is implemented with a processor executing software instructions.

22. The method of claim 12, wherein processing the OAM data unit in accordance with the first set of multiple OAM actions includes:
   retrieving an offset from an offset table using an offset index, wherein the offset index is specified by OAM action data corresponding to the first set of multiple OAM actions; and
   accessing a portion of the OAM data unit using the retrieved offset.

* * * * *